United States Patent
Tabata et al.

(10) Patent No.: US 8,397,847 B2
(45) Date of Patent: Mar. 19, 2013

(54) ELECTRIC POWER CONVERTER FOR VEHICLE

(75) Inventors: Mitsunori Tabata, Chiyoda-ku (JP); Masato Mori, Chiyoda-ku (JP); Kenji Nakajima, Chiyoda-ku (JP); Keinichi Akita, Chiyoda-ku (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 336 days.

(21) Appl. No.: 12/908,417

(22) Filed: Oct. 20, 2010

(65) Prior Publication Data
US 2011/0255320 A1 Oct. 20, 2011

(30) Foreign Application Priority Data
Apr. 15, 2010 (JP) .................................. 2010-093929

(51) Int. Cl.
*B62D 61/06* (2006.01)
(52) U.S. Cl. ...................... 180/65.21; 318/800; 363/127
(58) Field of Classification Search .............. 363/17–20, 363/25, 21.06, 21.12, 21.13, 21.14, 21.18, 363/71, 73, 84, 89, 127; 323/282–289, 266, 323/267, 271–275, 224; 180/65.01, 65.21, 180/65.25, 65.235, 65.265, 65.275; 307/64, 307/66; 318/139, 375, 376, 800
See application file for complete search history.

(56) References Cited

U.S. PATENT DOCUMENTS

| | | | | |
|---|---|---|---|---|
| 5,818,704 A | * | 10/1998 | Martinez | 363/21.06 |
| 5,934,395 A | * | 8/1999 | Koide et al. | 180/65.235 |
| 6,008,619 A | * | 12/1999 | Murase et al. | 318/811 |
| 6,502,652 B2 | * | 1/2003 | Rogg | 180/65.21 |
| 7,004,018 B2 | * | 2/2006 | Kadota et al. | 73/115.02 |
| 8,054,031 B2 | * | 11/2011 | Uechi | 318/800 |

FOREIGN PATENT DOCUMENTS

| | | |
|---|---|---|
| JP | 2007-300750 A | 11/2007 |
| JP | 4213170 B2 | 11/2007 |
| JP | 2009-284564 A | 12/2009 |

* cited by examiner

*Primary Examiner* — Rajnikant Patel
(74) *Attorney, Agent, or Firm* — Sughrue Mion, PLLC

(57) ABSTRACT

In an electric power converter for a vehicle which is connected to an alternating-current generator for a vehicle and performs synchronous rectification, switching mistakes are reduced and efficiency is improved by setting an optimal control allowance time in generating a switching timing signal from a diode ON signal. A control allowance according to the operating state of a generator can be determined by obtaining a control allowance time as a sum of a control delay time which is constant irrespective of the operating state of the generator, and an allowance time which varies depending on the operating state of the generator. Thereby, optimal switching timing is obtained and the reduction of switching mistakes and an improvement in efficiency are performed.

6 Claims, 11 Drawing Sheets

ELECTRIC POWER CONVERTER FOR VEHICLE

BACKGROUND OF THE INVENTION

1. Field of the Invention

The present invention relates to an electric power converter for a vehicle connected between an alternating-current generator and a direct-current device.

2. Description of the Background Art

An electric power converter for a vehicle which performs electric power conversion between a direct-current device, such as a battery or a lighting device, and a generator which is an alternating-current device is used for a vehicle, such as an automobile mounted with an alternating-current generator for a vehicle (hereinafter referred to as a generator).

Generally, such an electric power converter for a vehicle is connected between a generator and a battery, and a multi-phase bridge circuit is constituted by a plurality of diode elements. The electric power converter for a vehicle rectifies the alternating-current power generated by the generator by means of the aforementioned multi-phase bridge circuit, converts the alternating-current power into direct-current power, and supplies the direct-current power to the battery.

In recent years, an electric power converter for a vehicle using a switching element and a parasitic diode annexed thereto, and using rectification (hereinafter referred to as synchronous rectification) by the switching element has been proposed instead of the diode since the rectification using the switching element is more efficient than the rectification using the diode bridge, and is of less generation of heat of the elements. The proposed electric power converter for a vehicle has been adapted so that an execution permission signal (hereinafter referred to as a diode ON signal) of synchronous rectification is generated depending on the energization state of a parasitic diode, and switching control of the switching element is performed on the basis of this diode ON signal (described in, for example, JP-A-2009-284564).

In the conventional electric power converter for a vehicle, a diode ON signal is generated from the energization state of a diode and a switching timing signal is generated on the basis of this diode ON signal, to perform switching control of the switching element. At this time, as a method of generating the switching timing signal from the diode ON signal, JP-A-2009-284564 suggests using a control allowance time in which the delay time of control and the rotational fluctuation of the generator are taken into consideration.

However, since a technique for optimizing this control allowance time is not suggested, there is a problem in that excess and deficiency of the control allowance time occur due to the rotational fluctuation or load fluctuation depending on setting methods of the control allowance time, and as a result, decreases in efficiency or switching mistakes occur.

SUMMARY OF THE INVENTION

The present invention was made in order to solve the above problem in the conventional apparatus, and the object thereof is to set an optimal control allowance time, thereby reducing switching mistakes and further improving efficiency.

The electric power converter for a vehicle related to this invention is an electric power converter for a vehicle including: an electric power conversion unit connected as a multi-phase bridge circuit configuration between a rotating electrical machine unit driven from the outside to generate multi-phase alternating current electric power, and a direct-current device, each phase arm of the multi-phase bridge circuit including a switching element having a parallel-connected diode; a synchronous rectification permission means which generates a diode ON signal corresponding to the energization state of the diode; and a synchronous rectification control means which generates a switching timing signal for a switching element corresponding to the diode ON signal on the basis of the diode ON signal, and performing switching control of the corresponding switching element on the basis of the switching timing signal from the synchronous rectification control means, thereby executing synchronous rectification. The switching timing signal is obtained by subtracting a control allowance time from a synchronous rectification available time calculated on the basis of the ON time of at least one diode, and the control allowance time is determined as a sum of a control delay time which is constant irrespective of the operating state of a generator, and a control allowance which is an allowance time which varies depending on the operating state of the generator.

Additionally, the allowance time which varies depending on the operating state of the generator of the electric power converter for a vehicle related to this invention is determined depending on the acceleration and rotating speed of the generator.

Additionally, the allowance time which varies depending on the operating state of the generator of the electric power converter for a vehicle related to this invention is determined depending on the acceleration, rotating speed, and output voltage of the generator.

Additionally, the allowance time which varies depending on the operating state of the generator of the electric power converter for a vehicle related to this invention is determined depending on the acceleration, rotating speed, and an execution permission time of the generator.

Additionally, in the electric power converter for a vehicle according to this invention, the allowance time which varies depending on the operating state of the generator is determined on the basis of the operating state of the generator when the rotating speed of the generator is less than a predetermined rotating speed, and the allowance time which varies depending on the operating state of the generator is made constant when the rotating speed of the generator is equal to or greater than a predetermined rotating speed.

By changing the control allowance according to the operation condition of the generator, an optimal control allowance can be determined under various operating conditions, and an electric power converter for a vehicle which can perform reduction of a switching mistake and improvement in efficiency can be provided.

The foregoing and other objects, features, aspects, and advantages of the present invention will become more apparent from the following detailed description of the present invention when taken in conjunction with the accompanying drawings.

DETAILED DESCRIPTION OF THE INVENTION

Embodiment 1

Figure 1:
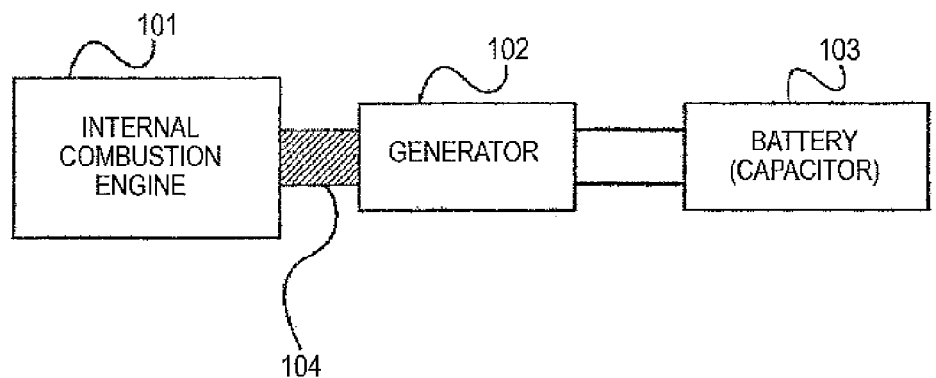
FIG. 1 shows a representative overall configuration related to this invention.

FIG. 1 is an explanatory view showing the configuration of a vehicle system equipped with a generator. In FIG. 1, a generator 102 is connected to an internal combustion engine 101 via a power transmission means 104, such as a belt. During the operation of the internal combustion engine 101, the alternating-current power generated by the generator 102 is converted into direct-current power by an electric power converter, and is supplied to a battery or a capacitor 103 to charge the battery or the capacitor with a predetermined voltage.

Figure 2:
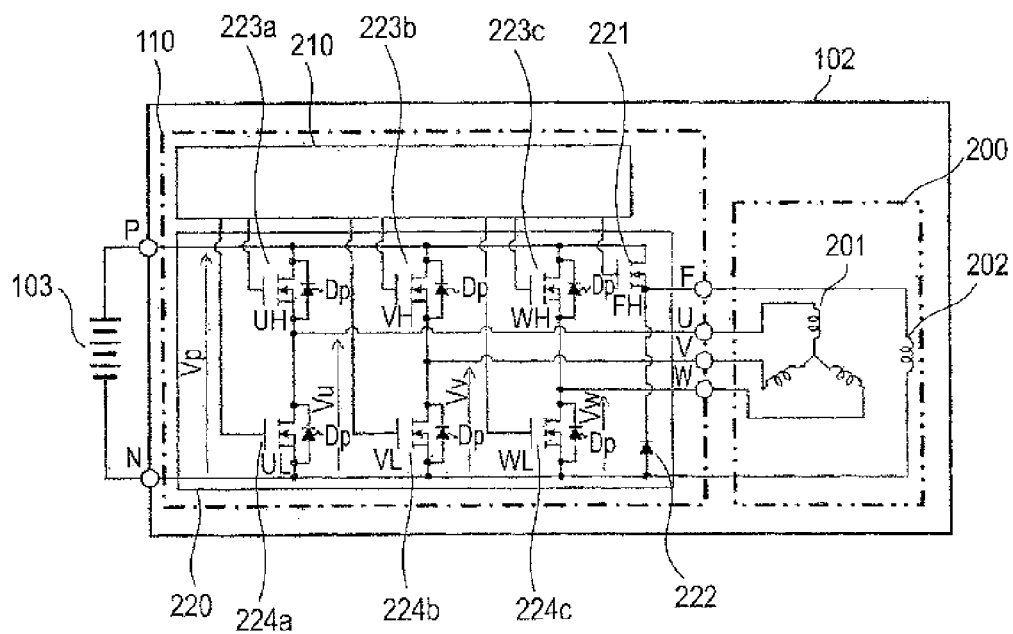
FIG. 2 is a configuration diagram of an electric power converter for a vehicle related to Embodiment 1 of this invention.

FIG. 2 is a configuration diagram showing the internal configuration of the generator 102 including an electric power converter for a vehicle according to Embodiment 1 of this invention. In FIG. 2, the generator 102 is constituted by an electric power converter 110 and a rotating electrical machine unit 200. The electric power converter 110 includes an electric power conversion unit 220, and a control device 210 which performs ON/OFF control of switching elements.

The electric power conversion unit 220 includes a field switching element (hereinafter referred to as a switching element FH) 221 for performing PWM control of a field current which energizes a field coil 202 of the rotating electrical machine unit 200, and a free wheel diode 222. Additionally, the electric power conversion unit 220 includes a three-phase bridge circuit constituted by a U-phase positive-electrode side arm switching element (hereinafter referred to as a switching element UH) 223a which constitutes a U-phase positive-electrode side arm UHA, a V-phase positive-electrode side arm switching element (hereinafter referred to as a switching element VH) 223b which constitutes a V-phase positive-electrode side arm VHA, and a W-phase positive-electrode side arm switching element (hereinafter referred to as a switching element WH) 223c which constitutes a W-phase positive-electrode side arm WHA, and a U-phase negative-electrode side arm switching element (hereinafter referred to as a switching element UL) 224a which constitutes a U-phase negative-electrode side arm ULA, a V-phase negative-electrode side arm switching element (hereinafter referred to as switching element VL) 224b which constitutes a V-phase negative-electrode side arm VLA, and a W-phase negative-electrode side arm switching element (referred to as a switching element WL) 224c which constitutes a W-phase negative-electrode side arm WLA.

As shown in the drawing, a parasitic diode Dp which is back-to-back connected is built in each of the switching elements UH223a, VH223b, WH223c, UL224a, VL224b, and WL224c.

In addition, although the positive-electrode side arm and the negative-electrode side arm may be referred to as an upper arm and a lower arm, respectively, the positive-electrode side arm and the negative-electrode side arm will be used as the names in the following description.

As for the armature coil 201 of the rotating electrical machine unit 200, three-phase terminals thereof are respectively connected to alternating-current side terminals U, V, and W of the electric power conversion unit 220. Both terminals of the field coil 202 are connected to a field terminal F and a negative-electrode side terminal N, respectively. The positive-electrode side terminal and negative-electrode side terminal of the battery 103 are respectively connected to direct-current side terminals P and N of the electric power conversion unit 220.

Each of the switching elements UH223a, VH223b, WH223c, UL224a, VL224b, WL224c, which constitute a three-phase bridge circuit of the electric power conversion unit 220, and the field switching element FH221 are switching-controlled by a gate signal given from the control device 210 as will be described later.

In addition, although FIG. 2 shows the rotating electric machine unit 200 as a three-phase field coil type generator including the three-phase armature coil 201 and the field coil 202, the number of phases or the field type (for example, permanent magnets or the like) may differ. Moreover, although FIG. 2 shows the generator 102 as an integral structural generating device in which the electric power converter 110 and the rotating electric machine unit 200 are integrally structured, the generator may be a separate structural generating device in which the electric power converter 110 and the rotating electric machine unit 200 are physically divided.

Figure 3:
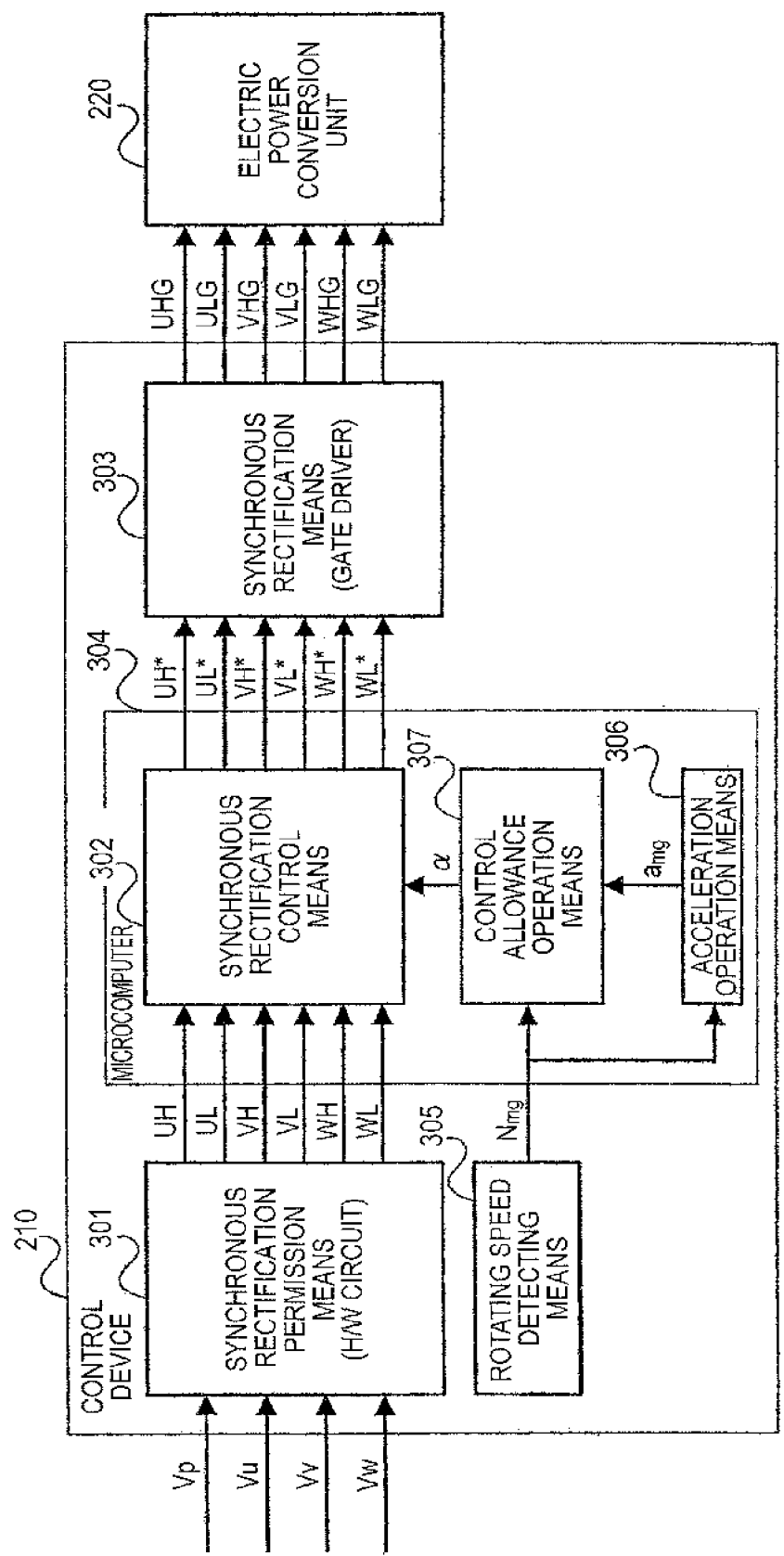
FIG. 3 is a view showing the configuration of a control device of the electric power converter for a vehicle related to Embodiment 1 of this invention.

FIG. 3 is a block diagram showing the configuration of the aforementioned control device 210. In FIG. 3, although the control device 210 and a microcomputer 304 have various functions of an electric power converter for a vehicle other than the functions shown in FIG. 3, portions related to Embodiment 1 of this invention will be mainly described in the following description. In FIG. 3, the synchronous rectification permission means 301 inputs a voltage Vp of the positive-electrode side terminal P, and terminal voltages Vu, Vv, and Vw of the three-phase individual terminals U, V, and W, on the basis of the electric potential of the negative-electrode side terminal N of the electric power conversion unit 220, detects, on the basis of the voltage Vp and the three-phase individual terminal voltages Vu, Vv, and Vw, whether or not a forward current flows into the parasitic diodes in a state where the individual switching elements UH223a, VH223b, and WH223c, and UL224a, VL224b, and WL224c of the three-phase bridge circuit are not turned on, and outputs diode ON signals UH, VH, WH, UL, VL, and WL with cycles corresponding to the cycles in the energized state of the diodes.

A control allowance operation means 307 has input thereto a signal Nmg corresponding to the rotating speed of the generator detected by a rotating speed detecting means 305, and a signal amg corresponding to the acceleration of the generator detected by an acceleration operation means 306, calculates a control allowance time α by a method which will be described later, and inputs the control allowance time to a synchronous rectification control means 302.

The synchronous rectification control means 302 has input thereto the diode ON signals UH, UL, VH, VL, WH, and WL which are outputs of the synchronous rectification permission means 301, and has also input thereto the control allowance time α calculated by the control allowance operation means 307. The synchronous rectification control means 302, as will be described later, calculates ON timings and OFF timings of the switching elements of the positive-electrode side arms and negative-electrode side arms for all the phases on the basis of these signals, outputs output signals UH*, UL*, VH*, VL*, WH*, and WL* corresponding to the calculated switching timings, and inputs the switching timings to the synchronous rectification means 303.

The synchronous rectification control means 302 measures the time of an ON state of each parasitic diode on the basis of the diode ON signals UH, UL, VH, VL, WH, and WL input from the synchronous rectification permission means 301. The synchronous rectification control means 302 also determines the synchronous rectification available time of each switching element from the past time (hereinafter referred to as diode ON time) of the ON state of each parasitic diodes measured by the positive-electrode side arms and negative-electrode side arms for all the phases.

The switching timings of the switching elements UH223a, VH223b, WH223c, UL224a, VL224b and WL224c are calculated from the synchronous rectification permission time obtained by subtracting the control allowance time α from this synchronous rectification available time, the signals UH*, UL*, VH*, VL*, WH*, and WL* corresponding to the switching timings are output, and the signals are input to the synchronous rectification means 303.

The synchronous rectification means 303 creates gate command signals UHG, ULG, VHG, VLG, WHG, and WLG given to the gates of the individual switching elements UH223a, VH223b, WH223c, UL224a, VL224b, and WL224c of the electric power converter 220 for a vehicle, on the basis of the output signals UH*, UL*, VH*, VL*, WH*, and WL* from the synchronous rectification control means 302, and inputs the gate command signals to the gates of the individual switching elements.

Figure 4:
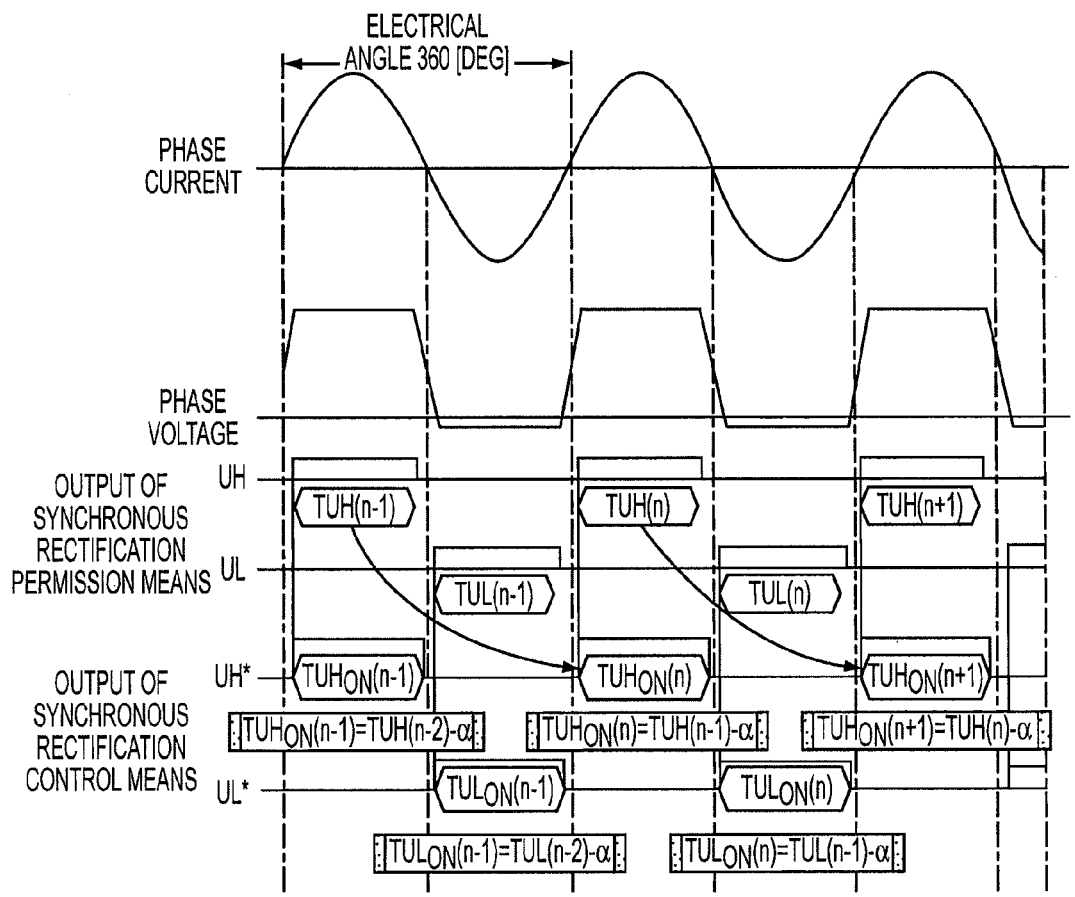
FIG. 4 is a timing chart of the electric power converter for a vehicle related to Embodiment 1 of this invention.

FIG. 4 is a timing chart illustrating the operation of the electric power converter for a vehicle according to Embodiment 1 of this invention. Here, a synchronous rectification operation will be described paying attention to the U-phase positive-electrode side arm UHA. In addition, although FIG. 4 shows the timing chart of only the U-phase, the same processing is performed for the V-phase and W-phase.

The synchronous rectification control means 302 measures the time in a state where the diode ON signal UH output from the synchronous rectification permission means 301 is energized, i.e., a diode ON time TUH (n−1) of the U-phase positive-electrode side arm UHA. Next, the synchronous rectification control means 302, as shown by Expression (1) shown below, calculates the time TUHon(n) obtained by subtracting the control allowance time α from the measured diode ON time TUH (n−1), as the time during which the switching element UH223a is turned on when the U-phase positive-electrode side arm UHA performs next synchronous rectification. Then, a signal which turns on the switching element by the calculated time TUHon(n) from a point of time when the diode ON signal UH is brought into an energized state next time is output as the output signal UH*, and is input to the synchronous rectification means 303.

$$TUHon(n)=TUH(n-1)-\alpha \qquad \text{Expression (1)}$$

Similarly, times TULon(n), TVHon(n), TVLon(n), TWHon(n), and TWLon(n) during which the individual switching elements UL224a, VH223b, VL224b, WH223c, and WL224c of the U-phase negative-electrode side arm ULA, V-phase positive-electrode side arm VHA, the V-phase negative-electrode side arm VLA, the W-phase positive-electrode side arm WHA, and the W-phase negative-electrode side arm WLA are brought into an ON state are independently calculated from the execution permission signals UL, VH, VL, WH, and WL, respectively, which are outputs of the synchronous rectification permission means 301, so that the control allowance time α is subtracted from the previous diode ON time for each phase, and signals corresponding to the calculated times TULon(n), TVHon(n), TVLon(n), TWHon(n), and TWLon(n), and the diode ON signals UL, VH, VL, WH, and WL are output as the output signals UL*, VH*, VL*, WH*, and WL*, respectively, and are input to the synchronous rectification control means 303.

The synchronous rectification means 303 creates gate command signals UHG, VHG, WHG, ULG, VLG, and WLG of the individual corresponding switching elements UH223a, VH223b, WH223c, UL224a, VL224b, and WL224c of the electric power conversion unit 220, on the basis of the output signals UH*, UL*, VH*, VL*, WH*, and WL* from the synchronous rectification control means 302, and inputs the gate command signals and the switching elements to the gates of the switching elements.

In the electric power conversion unit 220, ON/OFF of the switching elements UH223a, VH223b, WH223c, and UL224a, VL224b, and WL224c are controlled on the basis of the gate command signals UHG, VHG, WHG, ULG, VLG, and WLG from the synchronous rectification means 303, and switching operation synchronized with the ON-timing of each parasitic diode is performed to execute synchronous rectification.

In addition, in Embodiment 1 of this invention, TUHon(n) is obtained from Expression (1). However, the method described in JP-A-2009-284564 may be used, and other well-known methods may be used. This is also the same for the other arms.

Next, a method of calculating the control allowance time α will be described. The control allowance operation means 307, as shown in Expression (2) shown below, calculates the control allowance time α from a variable control allowance αv1 calculated from a control delay time αc which is constant irrespective of the operating state of the generator, a signal Nmg corresponding to the rotating speed of the generator detected by the rotating speed detecting means 305, and a signal amg corresponding to the acceleration of the generator generated by the acceleration operation means 306.

$$\alpha=\alpha c+\alpha v1 \qquad \text{Expression (2)}$$

The control delay time αc which is constant irrespective of the operating state of the generator only requires the time (hereinafter referred to as delay time) taken until the switching elements are actually turned on/off according to output signals thereof after the output signals UH*, UL*, VH*, VL*, WH*, and WL* of the synchronous rectification control means 302 are output. This delay time is determined depending on the circuit configuration or the like of the electric power conversion unit, and is a constant time regardless of the operating state of the generator, such as rotating speed or acceleration.

Meanwhile, the variable control allowance αv1 is required in order for the diode ON time to vary depending on the operating state of the generator.

Figure 5:
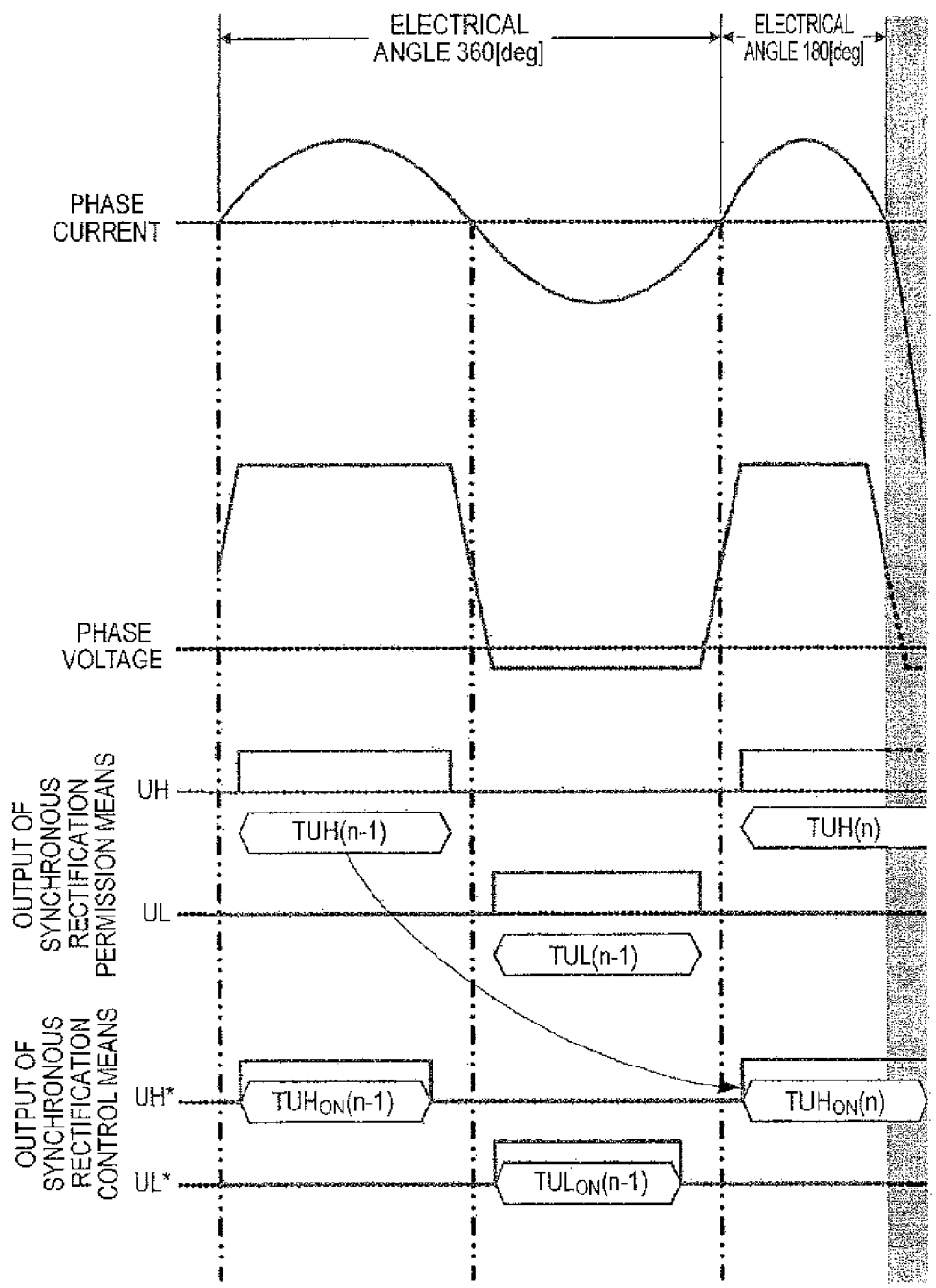
FIG. 5 is a timing chart of the electric power converter for a vehicle related to Embodiment 1 of this invention.

For example, in a case where the diode ON time becomes short suddenly due to a rotational variation as in FIG. 5, if the control allowance time α is insufficient, a switching element may be turned on even at times other than when the switching element can essentially be turned on, an electric current flows back from the battery, and an excessive electric current flows into the switching element as in a shaded portion portion in FIG. 5. Additionally, since a diode ON signal is brought into an energized state while a switching element is turned on, the diode ON signal cannot be normally detected in the meantime, and accurate diode ON time cannot be measured. Therefore, continuing synchronous rectification becomes impossible. An occurrence in which a switching element is turned on at times other than when the switching element can be turned on is referred to a switching mistake.

Figure 6:
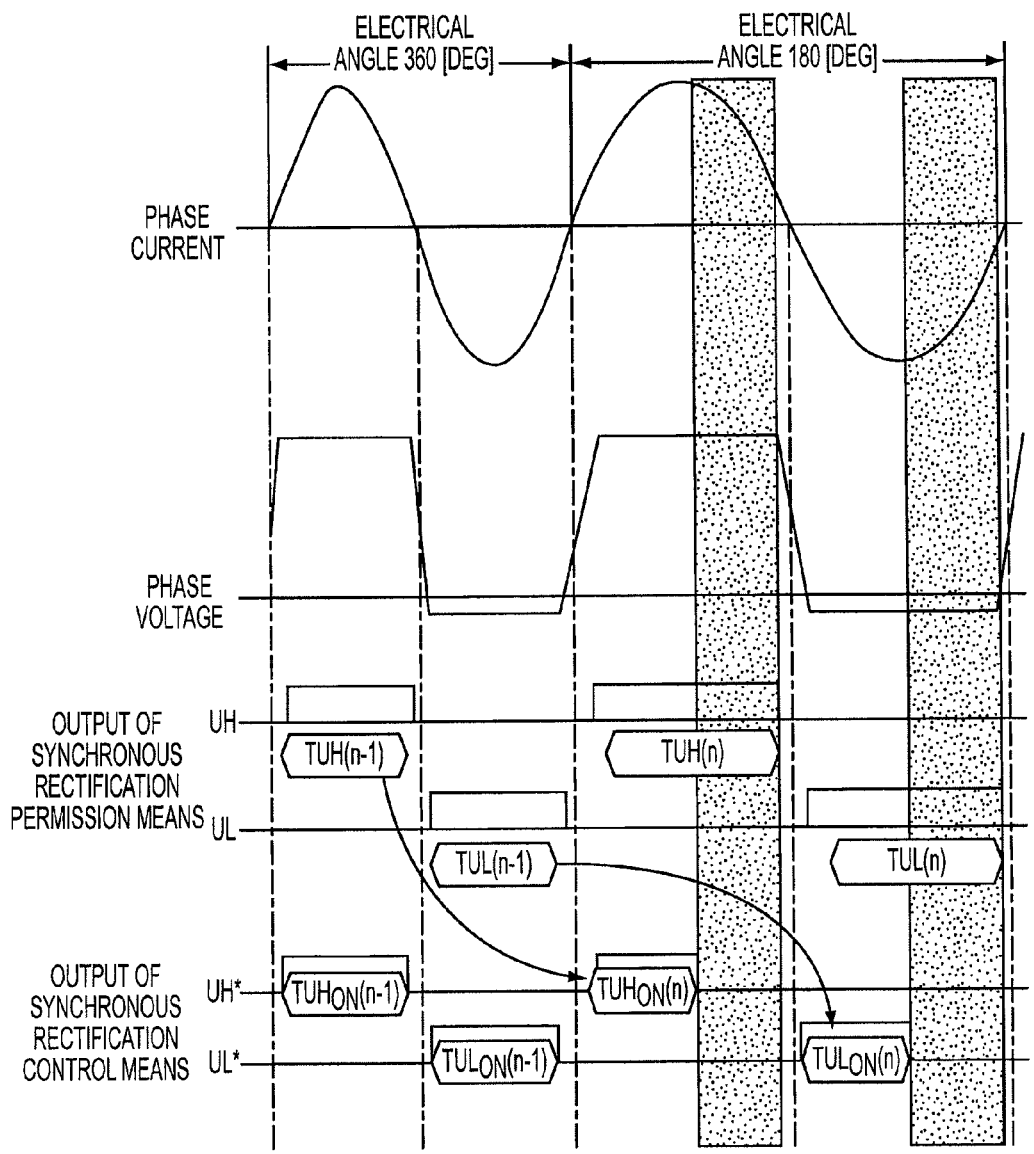
FIG. 6 is a timing chart of the electric power converter for a vehicle related to Embodiment 1 of this invention.

Additionally, in a case where the diode ON time becomes long suddenly due to a rotational variation as in FIG. 6, the interval where synchronous rectification is not performed irrespective of whether the synchronous rectification is possible increases as in a shaded portion in FIG. 6, and efficiency will be lowered.

Since the variation of the diode ON time varies depending on the rotating speed and acceleration of the generator, the variable control allowance αv1 is calculated depending on the signal Nmg corresponding to the rotating speed of the generator detected by the rotating speed detecting means 305 and the signal amg corresponding to the acceleration of the generator detected by the acceleration operation means 306.

Figure 7:
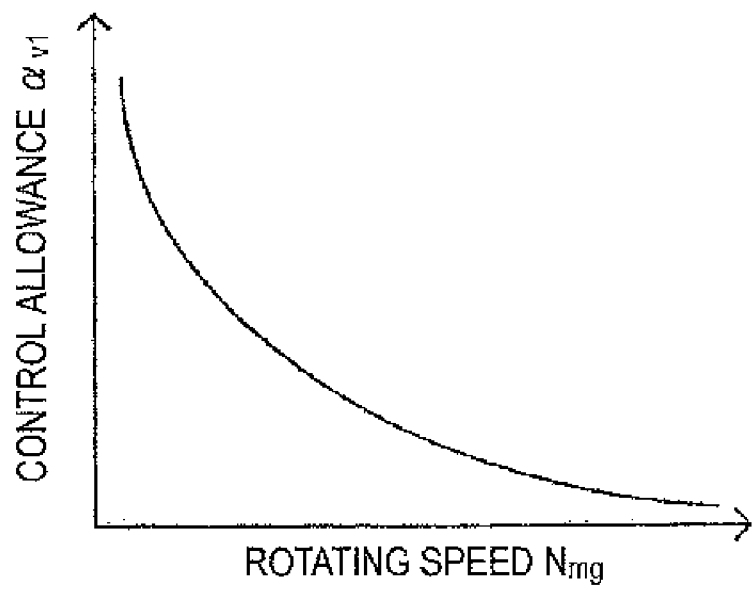
FIG. 7 is a view showing a method of setting the control allowance time of the electric power converter for a vehicle related to Embodiment 1 of this invention.
Figure 8:
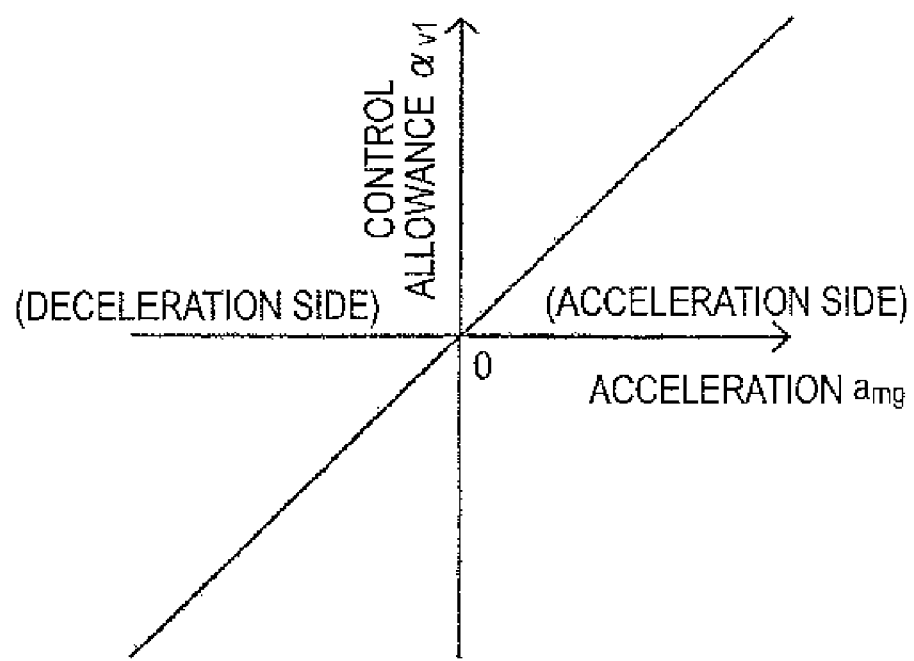
FIG. 8 is a view showing the method of setting the control allowance time of the electric power converter for a vehicle related to Embodiment 1 of this invention.

When the rotating speed varies at constant acceleration, the relationship between the rotating speed and the required variable control allowance αv1, as shown in FIG. 7, becomes large when the rotating speed is low, and becomes small when the rotating speed is high. As for the relationship between the acceleration and the required variable control allowance αv1, as shown in FIG. 8, the required control allowance αv1 becomes large in proportion to the acceleration.

Figure 9:
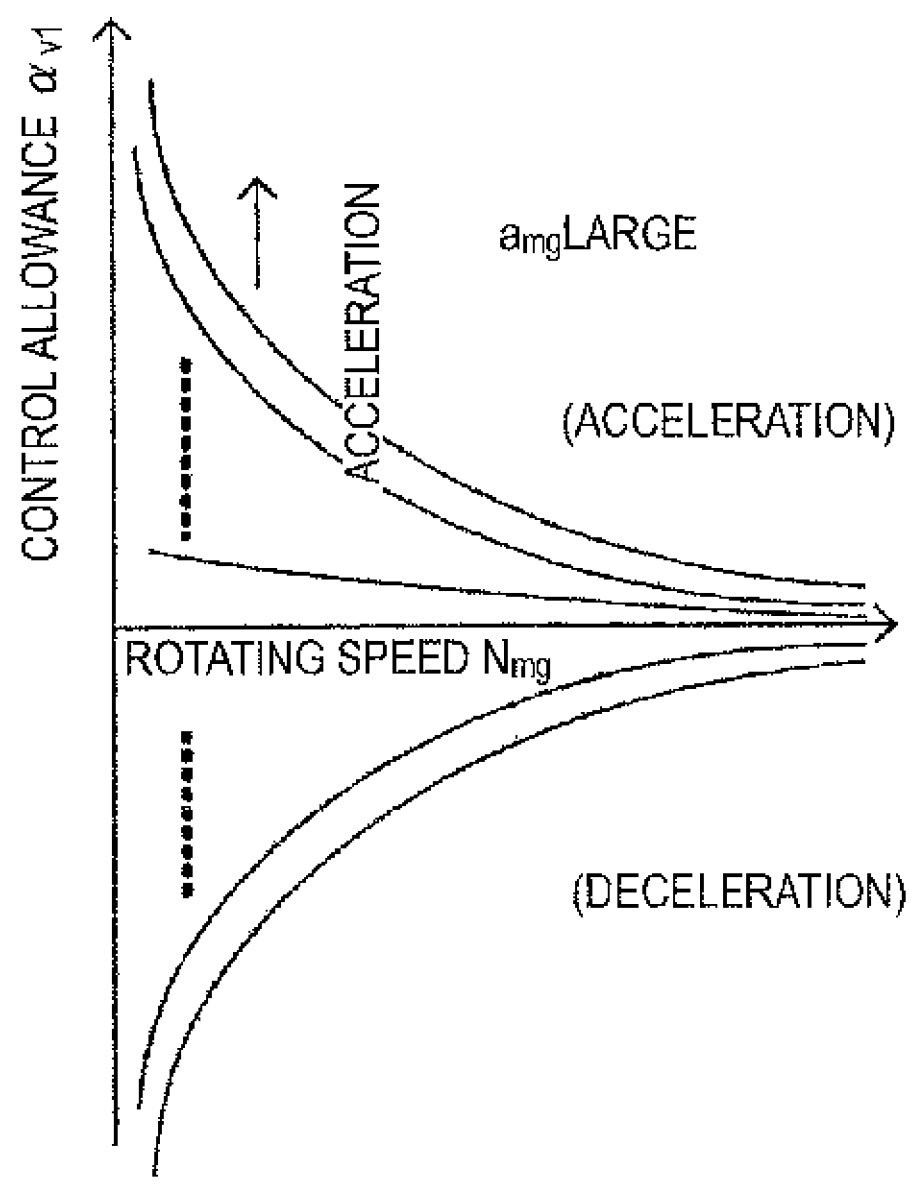
FIG. 9 is a view showing the method of setting the control allowance time of the electric power converter for a vehicle related to Embodiment 1 of this invention.

Accordingly, in order to obtain the variable control allowance αv1 in consideration of the rotating speed and acceleration, as shown in FIG. 9, it is only necessary to refer to a map of the variable control allowance αv1 corresponding to the rotating speed and acceleration, and obtain the control allowance time α from the obtained αv1. In addition, a map in which the control delay time αc which is constant irrespective of the operating state of the generator, and the variable control allowance αv1 are added in advance may be prepared, and may be used as the map of the control allowance time α corresponding to the rotating speed and acceleration.

In addition, when the acceleration is in a negative region, i.e., the rotating speed is decreasing, the required control allowance time α may become negative. That is, a switching element can be turned on for a longer time than synchronous rectification permission time calculated from past diode ON time. This can enhance the efficiency of the synchronous rectification at the time of deceleration, and increase the amount of energy which can be recovered by regenerative deceleration.

As mentioned above, according to the electric power converter for a vehicle of Embodiment 1, the control allowance time α which is optimal according to the operating state of the generator can be dynamically set. This can reduce the possibility of switching mistakes, and further improve efficiency.

In addition, although the generator has been described in the present Embodiment 1, the generator may be a generator motor also having a function as an electric motor. This is also the same in the following embodiments.

Embodiment 2

Next, an electric power converter for a vehicle related to Embodiment 2 of this invention will be described. Since Embodiment 2 is provided by modifying the operation method of the control allowance time α in Embodiment 1, and the others are the same as those of Embodiment 1, differences from Embodiment 1 will be described.

Figure 10:
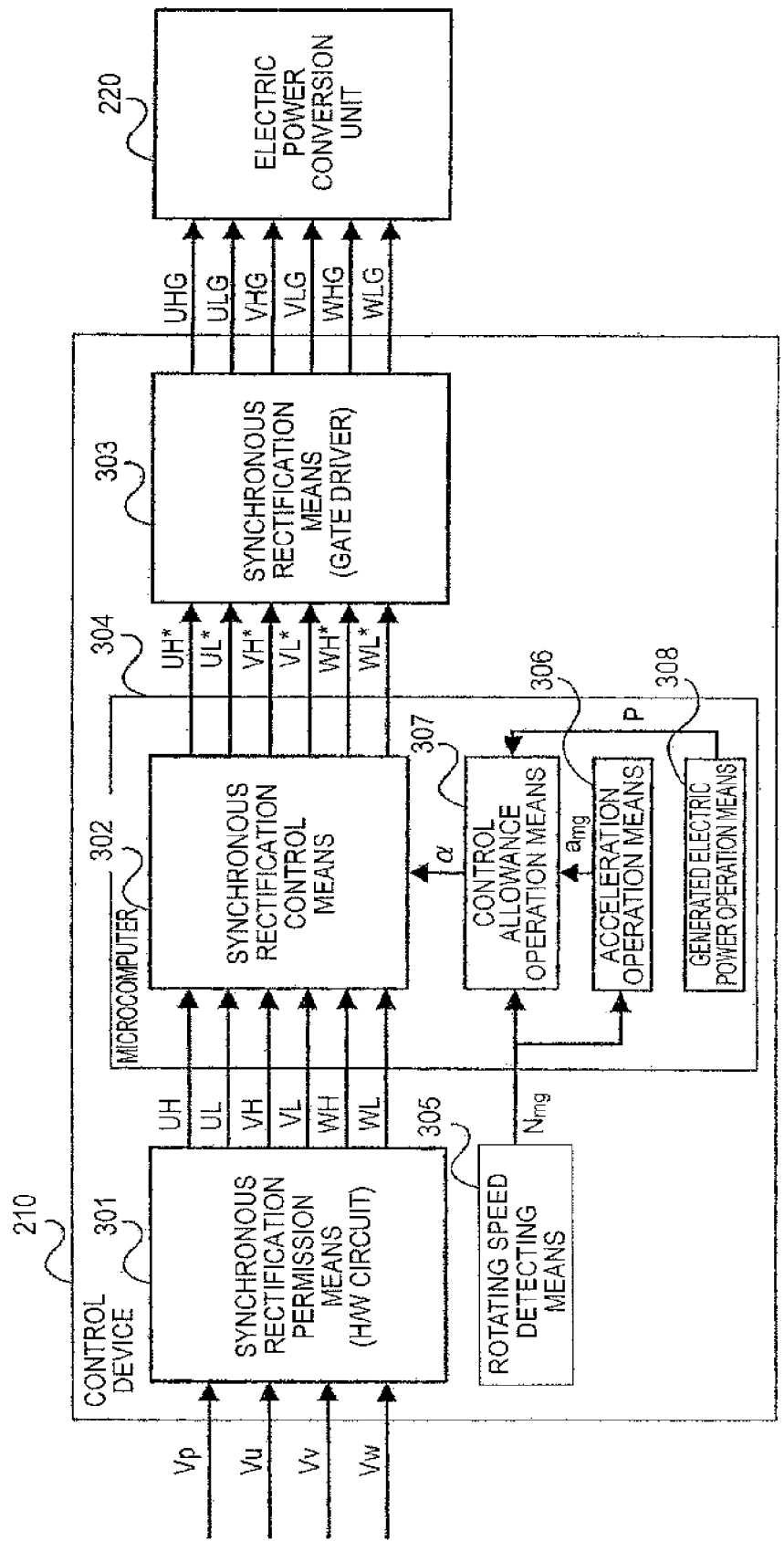
FIG. 10 is a view showing the configuration of a control device of an electric power converter for a vehicle related to Embodiment 2 of this invention.

FIG. 10 is a view showing the configuration of a control device of the electric power converter for a vehicle related to Embodiment 2 of this invention. The difference from Embodiment 1 is that a generated electric power operation means 308 outputting direct-current power output by the electric power converter 110 to the control allowance operation means 307 is provided.

The generated electric power operation means 308 calculates direct-current power output by the electric power converter 110, and outputs a signal P corresponding thereto. If the electric power converter 110 includes a current sensor, the generated electric power may be obtained by the product of an output current value of the sensor, and the direct-current voltage Vp, or may be obtained by estimating the output current by the method suggested in Japanese Patent No. 4213170, and obtaining the product of the estimated current and the direct-current voltage Vp, or other well-known techniques may be used the calculation of the generated electric power.

In Embodiment 1, the control allowance operation means 307 calculates the control allowance time α from the signal Nmg corresponding to the rotating speed of the generator detected by the rotating speed detecting means 305, and the signal amg corresponding to the acceleration of the generator detected by the acceleration operation means 306.

Figure 11:
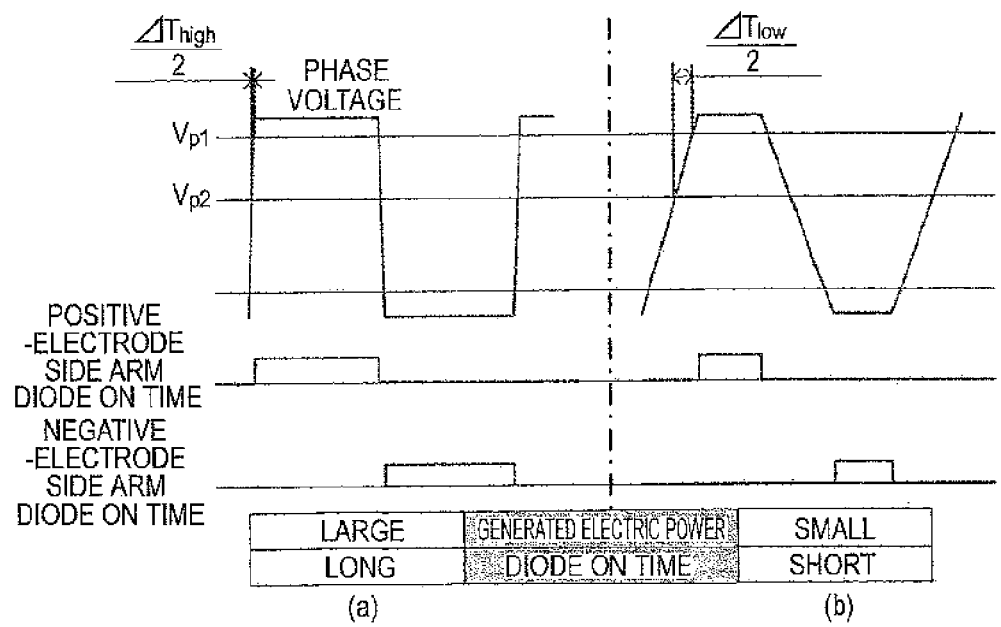
FIG. 11 is a timing chart of the electric power converter for a vehicle related to Embodiments 2 and 3 of this invention.

However, as shown in FIG. 11, in a case where the cycle of a phase voltage is constant (i.e., in a case where the rotating speed of the generator is constant), the inclination of a phase voltage waveform when the generated electric power is small becomes gentler compared to that when the generated electric power is large.

Therefore, in a case where direct-current voltages have equally varied from Vp1 to Vp2, the variation of the diode ON time becomes ΔThigh<ΔTlow when a variation when the generated electric power is large is defined as ΔThigh, and a variation when the generated electric power is small is defined as ΔTlow. As a result, the varying of the diode ON time when the direct-current voltage has varied is larger when the generated electric power is small. Therefore, more control allowance time α is required compared to when the generated electric power is large.

Figure 12:
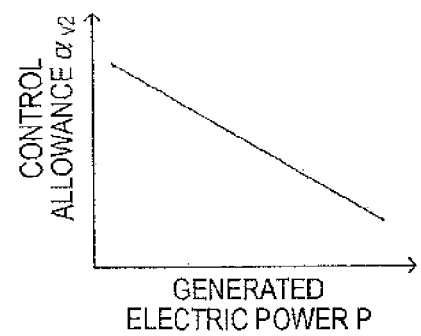
FIG. 12 is a view showing the method of setting the control allowance time of the electric power converter for a vehicle related to Embodiment 2 of this invention.

Therefore, in Embodiment 2, a control allowance αv2, as shown in FIG. 12, which is determined by the generated electric power, is calculated, and the control allowance time α is determined as shown in Expression (3) using the control allowance αv2. αv2 is obtained with reference to a map of the control allowance αv2 to the generated electric power. In this map, the values obtained by experiment or the like are used as map values.

$$\alpha = \alpha c + \alpha v1 + \alpha v2 \quad \text{Expression (3)}$$

As shown by Expression (3), by making the control allowance time α variable according to the generated electric power, switching suitable for the varying of the diode ON time caused by the fluctuation of the direct-current voltage is performed, switching mistakes are prevented, and stable synchronous rectification is enabled.

As mentioned above, according to the electric power converter for a vehicle of Embodiment 2, when the generated electric power is small, more control allowance time α can be secured than when the generated electric power is large. Thereby, even when the generated electric power is small, switching mistakes can be reduced, and stable synchronous rectification can be realized.

Embodiment 3

Next, an electric power converter for a vehicle related to Embodiment 3 of this invention will be described. Since Embodiment 3 is provided by modifying the operation method of the control allowance time α in Embodiment 1, and is otherwise the same as Embodiment 1, differences from Embodiment 1 will be described.

Figure 13:
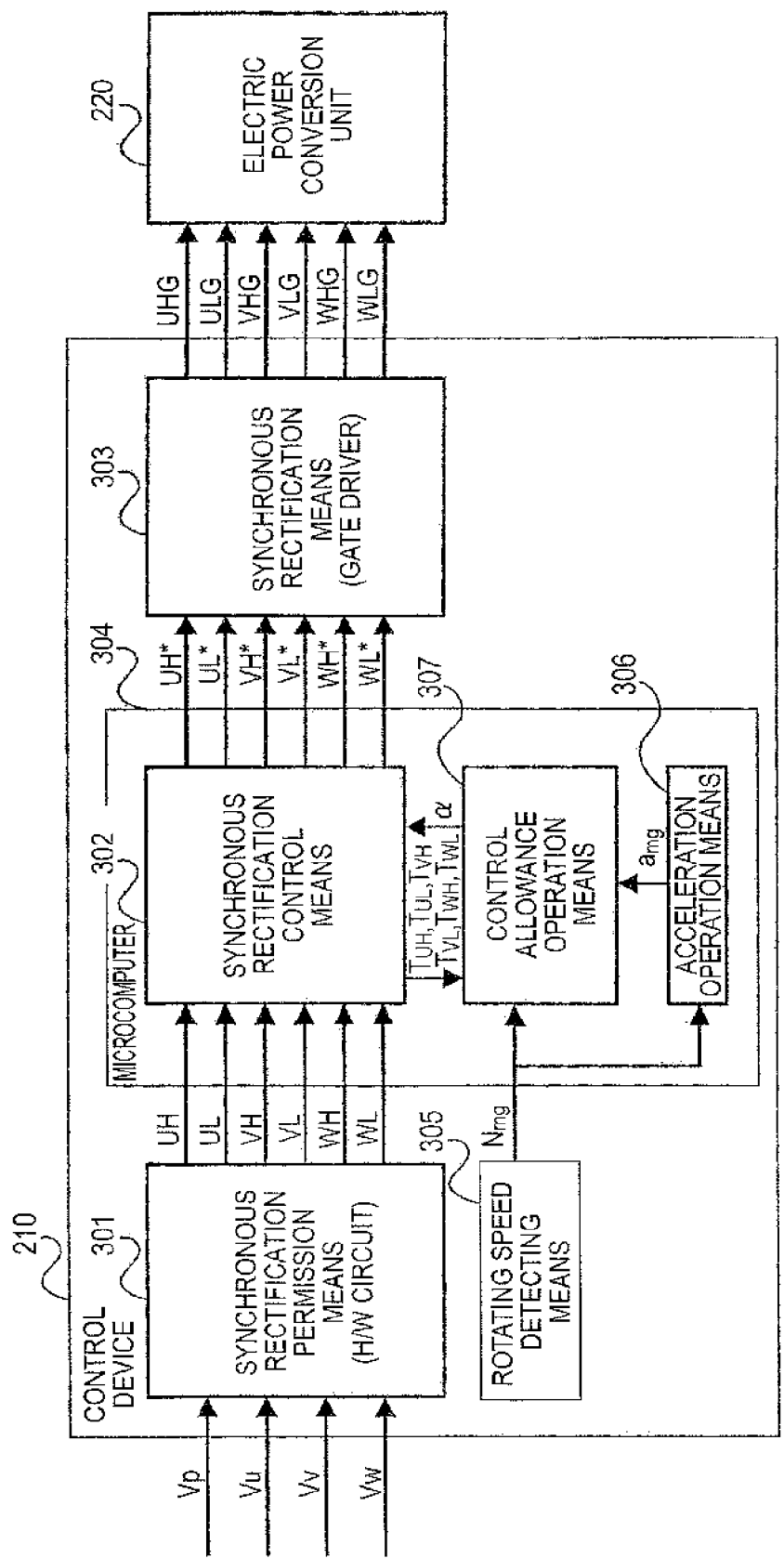
FIG. 13 is a view showing the configuration of a control device of the electric power converter for a vehicle related to Embodiment 3 of this invention.

FIG. 13 is a view showing the configuration of a control device of the electric power converter for a vehicle related to Embodiment 3 of this invention.

The difference from Embodiment 1 is that the diode ON times TUH, TUL, TVH, TVL, TWH, and TWL are input to the control allowance operation means 307 from the synchronous rectification control means.

In Embodiment 1, the control allowance operation means 307 has calculated the control allowance time α from the signal Nmg corresponding to the rotating speed of the generator detected by the rotating speed detecting means 305, and the signal amg corresponding to the acceleration of the generator detected by the acceleration operation means 306.

On the other hand, in Embodiment 2, as shown in FIG. 11, in a case where the cycle of a phase voltage is constant, i.e., in a case where the rotating speed of the generator is constant, the inclination of a phase voltage waveform when the diode ON time shown in FIG. 11B is short becomes gentler compared to the inclination of a phase voltage waveform when the diode ON time shown in FIG. 11A is long.

Therefore, in a case where direct-current voltages have varied equally from Vp1 to Vp2, the variation of the diode ON time becomes ΔThigh<ΔTlow when the variation of the diode ON time in FIG. 11A is defined as ΔThigh, and the variation of the diode ON time in FIG. 11B is defined as ΔTlow. Therefore, the variation of the diode ON time becomes larger when the diode ON time is short as shown in FIG. 11A. As a result, more control allowance time α is required compared to when the diode ON time is long as shown in FIG. 11B.

Figure 14:
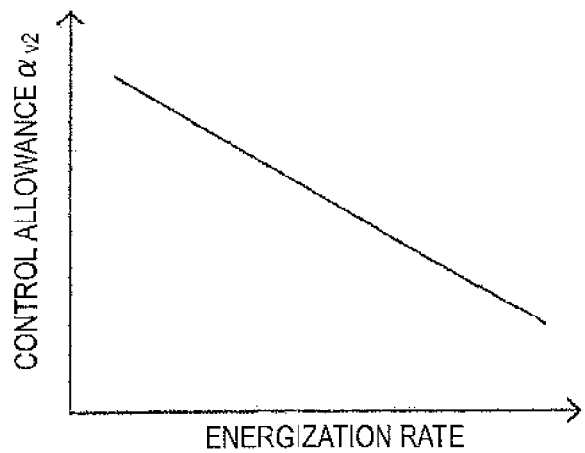
FIG. 14 is a view showing the method of setting the control allowance time of the electric power converter for a vehicle related to Embodiment 3 of this invention.

Therefore, in Embodiment 3, the ratio (referred to as energization rate) of the diode ON time to the time equivalent to an electrical angle of 180 degrees is obtained, the control allowance αv2 determined depending on the energization rate is calculated, and the control allowance time α is determined as shown by Expression (3) using the control allowance αv2. αv2 is obtained with reference to a map of the control allowance αv2 to the energization rate as shown in FIG. 14. In this map, the values obtained by experiment or the like are used as map values.

As mentioned above, according to the electric power converter for a vehicle of Embodiment 3, as shown by Expression (3), by making the control allowance time α variable according to the diode ON time, switching suitable for the varying of the diode ON time is performed, switching mistakes are prevented, and stable synchronous rectification is enabled. Accordingly, when the diode ON time is short, more control allowance time α can be secured compared to that when the diode ON time is long. Thereby, switching mistakes can be prevented, and stable synchronous rectification can be realized.

Embodiment 4

Next, an electric power converter for a vehicle related to Embodiment 4 of this invention will be described. Embodiment 4 is provided by modifying the operation method of the control allowance time α in Embodiment 1, and is otherwise the same as Embodiment 1.

Figure 15:
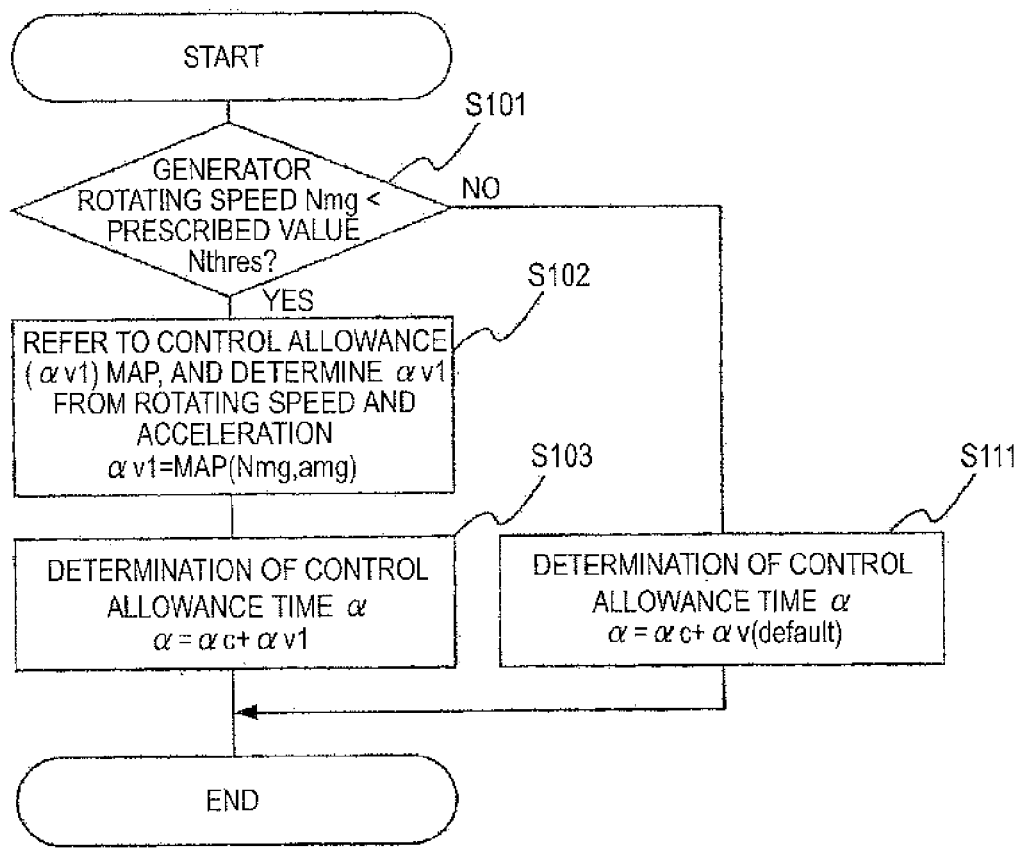
FIG. 15 is a flow chart of the control allowance time determination of an electric power converter for a vehicle related to Embodiment 4 of this invention.

The control allowance operation means 307 according to Embodiment 4 determines the control allowance time α along a flow chart shown in FIG. 15. First, in Step S101, it is determined whether or not the signal Nmg corresponding to the rotating speed of the generator detected by the rotating speed detecting means 305 is less than a prescribed value Nthres. Then, if the signal Nmg corresponding to the rotating speed of the generator detected by the rotating speed detecting means 305 is less than the prescribed value Nthres, the processing proceeds to Step S102. If not, the processing proceeds to Step S111.

In Step S102, the variable control allowance αv1 which is required in order for the diode ON time to vary depending on the operating state of the generator is calculated. Since this is the same as that of Embodiment 1, detailed description thereof is omitted. The processing proceeds to Step S103 after the end of Step S102.

In Step S103, the control allowance time α is determined. Since this is the same as that of Embodiment 1, detailed description thereof is omitted.

In Step S111, the control allowance time α is determined. The difference from the processing of Step S103 is that a control allowance αv (default) is used instead of the control allowance αv1.

If the rotating speed of the generator is sufficiently fast, as shown in FIG. 9, the value of the control allowance αv1 becomes small, and the occupying ratio of the control allowance time α to the total becomes small. Therefore, if the rotating speed of the generator is sufficiently fast, efficiency is not particularly decreased even when the control allowance time α is set to a constant value. Generally, if the rotating speed of the generator is fast, the processing load of the microcomputer 304 tends to become high. Therefore, if the rotating speed of the generator is sufficiently fast, the operation of the control allowance time α is omitted with the control allowance time α as a constant value. Thereby, the microcomputer processing load at the time of a high-speed rotation can be mitigated with hardly any reduction of efficiency.

In addition, the value of the control allowance αv (default) is set by calculating a required greatest value in advance at a rotating speed of the prescribed value Nthres or higher.

As mentioned above, according to the electric power converter for a vehicle by Embodiment 4, if the rotating speed of the generator is fast, and the processing load of the microcomputer is high, the operation of the control allowance time α is omitted with the control allowance time α as a constant value. Thereby, the microcomputer processing load can be mitigated with hardly any reduction of efficiency.

Various modifications and alterations of this invention will be apparent to those skilled in the art without departing from the scope and spirit of this invention, and it should be understood that this is not limited to the illustrative embodiments set forth herein.

What is claimed is:

1. An electric power converter for a vehicle comprising:

an electric power conversion unit connected as a multiphase bridge circuit configuration between a rotating electrical machine unit driven from the outside to generate multi-phase alternating current electric power, and a direct-current device, each phase arm of the multiphase bridge circuit including a switching element having a parallel-connected diode;

a synchronous rectification permission means which generates a diode ON signal corresponding to the energization state of the diode; and a synchronous rectification control means which generates a switching timing signal for a switching element corresponding to the diode ON signal on the basis of the diode ON signal, and performing switching control of the corresponding switching element on the basis of the switching timing signal from the synchronous commutation control means, thereby executing synchronous rectification, wherein the switching timing signal is obtained by subtracting a control allowance time from a synchronous commutation available time calculated on the basis of the ON time of at least one diode, and wherein the control allowance time is determined as a sum of a control delay time which is constant irrespective of the operating state of a generator, and a control allowance which is an allowance time which varies depending on the operating state of the generator.

2. The electric power converter for a vehicle according to claim 1, wherein the control allowance which varies depending on the operating state of the generator is determined depending on the acceleration and rotating speed of the generator.

3. The electric power converter for a vehicle according to claim 1, wherein the control allowance which varies depending on the operating state of the generator is determined depending on the acceleration and rotating speed of the generator, and the output power of the generator.

4. The electric power converter for a vehicle according to claim 1, wherein the control allowance which varies depending on the operating state of the generator is determined depending on the acceleration and rotating speed of the generator, and the ON time of the diode.

5. The electric power converter for a vehicle according to claim 1, wherein the allowance time which varies depending on the operating state of the generator is determined from the operating state of the generator when the rotating speed of the generator is equal to or lower than a predetermined rotating speed, and a value which is determined in advance is used as the allowance time which varies depending on the operating state of the generator when the rotating speed of the generator exceeds a predetermined rotating speed.

6. The electric power converter for a vehicle according to claim 1, wherein the generator connected to the electric power converter for a vehicle is a generator motor.

* * * * *